US006670904B1

(12) United States Patent
Yakovlev

(10) Patent No.: US 6,670,904 B1
(45) Date of Patent: Dec. 30, 2003

(54) DOUBLE-RAMP ADC FOR CMOS SENSORS

(75) Inventor: Alexey Yakovlev, Temple City, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/225,427

(22) Filed: Aug. 22, 2002

(51) Int. Cl.[7] ............................................ H03M 1/82
(52) U.S. Cl. ................................... 341/167; 341/165
(58) Field of Search ............................ 341/155, 153, 341/118, 120, 156, 164, 165, 169

(56) References Cited

U.S. PATENT DOCUMENTS

| | | | |
|---|---|---|---|
| 5,461,425 A | 10/1995 | Fowler et al. | |
| 5,801,657 A | 9/1998 | Fowler et al. | |
| 5,877,715 A | 3/1999 | Gowda et al. | |
| 5,920,274 A | 7/1999 | Gowda et al. | |
| 6,204,524 B1 | 3/2001 | Rhodes | |
| 6,362,767 B1 * | 3/2002 | Yang et al. | 341/155 |
| 6,545,624 B2 * | 4/2003 | Lee et al. | 341/155 |

OTHER PUBLICATIONS

MP 6.4 A 60mW 10b CMOS Image Sensor with Column–to–Column FPN Reduction.

* cited by examiner

*Primary Examiner*—Brian Young
*Assistant Examiner*—Joseph Lauture
(74) *Attorney, Agent, or Firm*—Dickstein Shapiro Morin & Oshinsky LLP

(57) ABSTRACT

A double ramp ADC within an image sensor. The double ramp ADC divides the analog-to-digital conversion process into two steps. During the first step of the conversion, the ADC runs through the potential digital values roughly, using coarse counter steps, and maintains a coarse digital output value. During the second step, the ADC runs through the individual digital values within the range of values associated with the coarse digital value. Thus, the second step runs through the fine digital values associated with the coarse digital value. The coarse and fine digital values are output as the converted digital value of the analog input voltage. The double ramp ADC should reduce the analog-to-digital conversion cycle time by up to $2^{(n/2-1)}$ times that of the conventional analog-to-digital conversion cycle using ramp ADCs, where n is a number of bits of digital output (i.e., resolution) of the ADCs.

51 Claims, 9 Drawing Sheets

DOUBLE-RAMP ADC FOR CMOS SENSORS

FIELD OF THE INVENTION

The present invention relates generally to improved semiconductor imaging devices and, more particularly to a double ramp analog-to-digital (ADC) converter for CMOS image sensors.

BACKGROUND OF THE INVENTION

A CMOS imager circuit includes a focal plane array of pixel cells, each one of the cells including either a photogate, photoconductor or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image lag can be eliminated by completely depleting the photodiode upon readout.

CMOS imagers of the type discussed above are generally known as discussed, for example, in U.S. Pat. No. 6,204,524, assigned to Micron Technology, Inc., which is hereby incorporated by reference in its entirety.

FIG. 1 illustrates a block diagram for a CMOS imager 100. The imager 100 includes a pixel array 200. The pixel array 200 comprises a plurality of pixels arranged in a predetermined number of columns and rows. The pixels of each row in array 200 are all turned on at the same time by a row select line and the pixels of each column are selectively output by a column select line. A plurality of rows and column lines are provided for the entire array 200.

The row lines are selectively activated by the row driver 210 in response to row address decoder 220 and the column select lines are selectively activated by the column driver 260 in response to column address decoder 270. Thus, a row and column address is provided for each pixel. The CMOS imager 100 is operated by the control circuit 250 which controls address decoders 220, 270 for selecting the appropriate row and column lines for pixel readout, and row and column driver circuitry 210, 260 which apply driving voltage to the drive transistors of the selected row and column lines.

The pixel signal output from the pixel array is analog voltage. This pixel output signal must then be converted from an analog signal to a digital signal. Thus, the pixel output signal is usually sent to an analog-to-digital converter ("ADC") (not shown).

Many CMOS image sensors use a ramp ADC which is essentially a comparator and appropriate control logic. In the conventional ramp ADC, an input voltage of the signal to be converted is compared with a gradually increasing reference voltage. The gradually increasing reference voltage is generated by a digital-to-analog converter ("DAC") as it sequences through and converts digital codes into analog voltages. This gradually increasing reference voltage is known as the ramp voltage. In operation, when the ramp voltage reaches the value of the input voltage, the comparator generates a signal that latches the digital code of the DAC. The latched digital code is used as the output of the ADC.

The problem with the ramp ADC is that it must step through, one value at a time, all possible digital values that could be generated and output by the ADC. For example, if the CMOS sensor has a 12-bit resolution, then a 12-bit ramp ADC must be used to obtain the correct digital output. For a 12-bit ramp ADC there may be 4,096 steps in any single conversion cycle to ensure that the input voltage is converted to the appropriate digital code (one of 4,096 possibilities). This is a very long conversion period, which increases by a factor of two for every additional bit of resolution in the sensor. Since it is desirable to increase the resolution of CMOS image sensors, it is desirable to decrease the number of steps in the analog-to-digital conversion cycle.

Accordingly, there is a desire and need for an ADC that substantially decreases the analog-to-digital conversion time in a CMOS sensor that uses ramp ADCs.

SUMMARY OF THE INVENTION

The present invention provides an ADC that substantially decreases the analog-to-digital conversion time in a CMOS sensor that uses ramp ADCs.

The above and other features and advantages are achieved by implementing a double ramp ADC within a CMOS image sensor. The double ramp ADC divides the analog-to-digital conversion process into two steps. During the first step of the conversion, the ADC runs through the potential digital values roughly, using coarse counter steps, and maintains a coarse digital output value. During the second step, the ADC runs through the individual digital values within the range of values associated with the coarse digital value. Thus, the second step runs through the fine digital values associated with the coarse digital value. The coarse and fine digital values are output as the converted digital value of the analog input voltage. The double ramp ADC should reduce the analog-to-digital conversion cycle time by up to $2^{(n/2-1)}$ times that of the conventional analog-to-digital conversion cycle, where n is a number of bits of digital output (i.e., resolution) of the A)C.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

Figure 1:
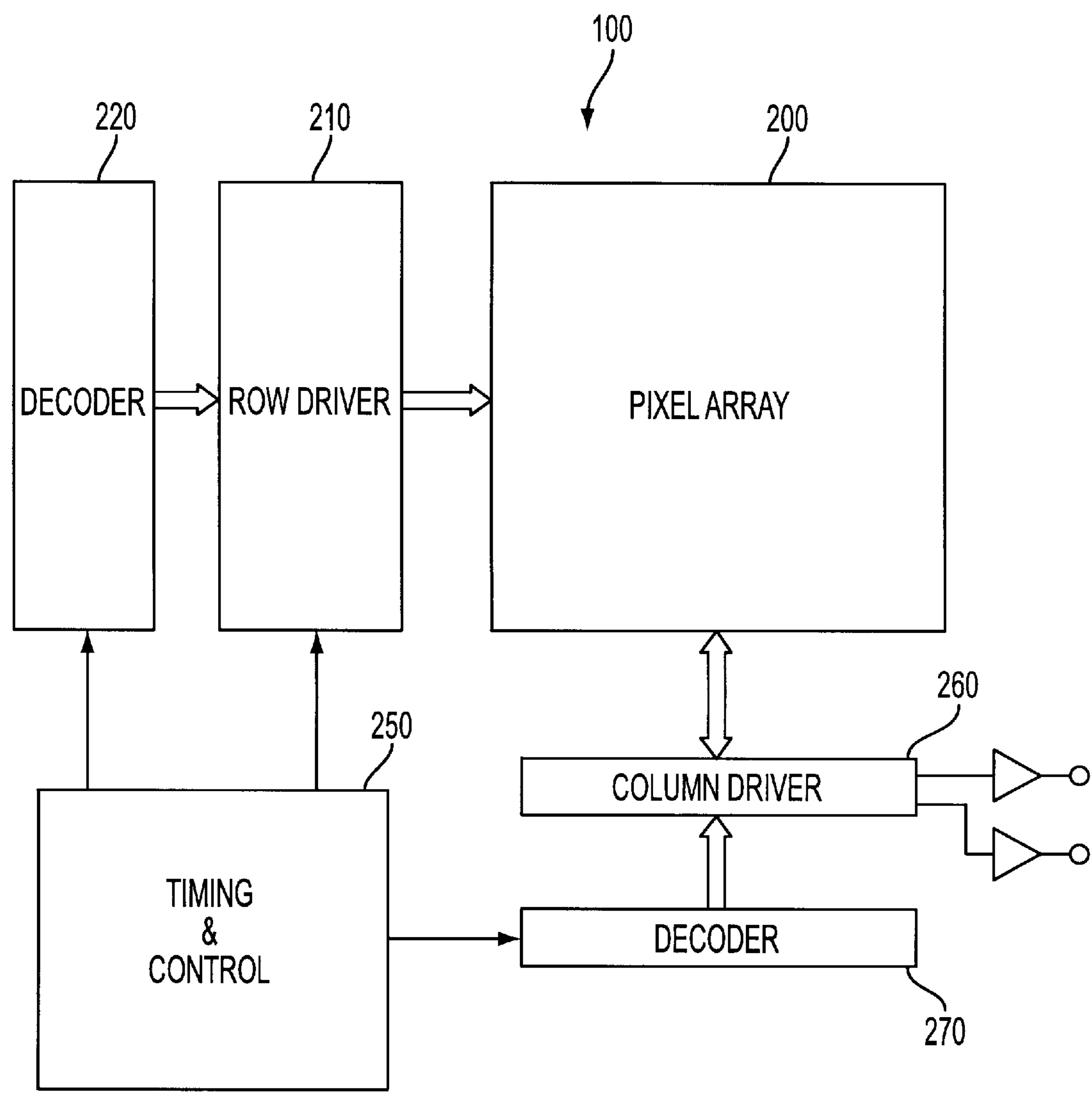
FIG. 1 is a block diagram of a CMOS image sensor chip.
Figure 2:
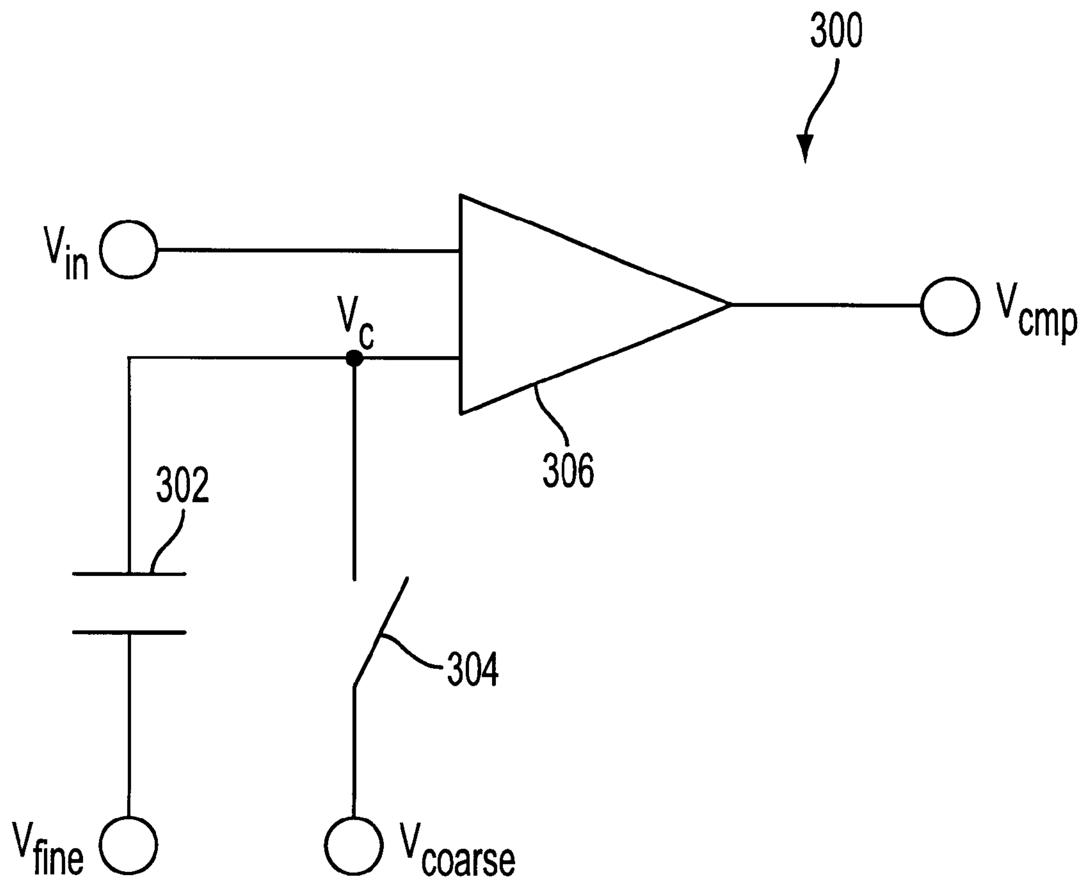
FIG. 2 is a circuit diagram illustrating an exemplary double ramp ADC constructed in accordance with an embodiment of the invention.

FIG. 2 is a circuit diagram illustrating an exemplary double ramp ADC 300 constructed in accordance with an embodiment of the invention. In a preferred embodiment, the ADC 300 is used in a CMOS image sensor to convert analog pixel information into a digital code.

The ADC 300 includes a capacitor 302, switch 304 and a comparator 306. The comparator 306 receives the input voltage Vin to be converted. The input voltage Vin is an analog voltage output from a pixel within a pixel array of a CMOS image sensor. The capacitor 302 is connected between a fine ramp voltage Vfine and the other input of the comparator 306. The switch 304 is connected between a coarse ramp voltage Vcoarse and the input of the comparator 306 connected to the capacitor.

It should be appreciated that each pixel outputs a reset voltage and a pixel image voltage (typically the reset voltage plus a photodiode voltage) as described in U.S. Pat. No. 6,204,524. These two voltages can be subtracted and the subtracted voltage used as the input voltage Vin. Furthermore, the reset and pixel image voltages can be sent to the ADC 300, which converts each voltage into a respective digital code. The subtraction can then be performed using the digital codes rather than the analog voltages.

Figure 3:
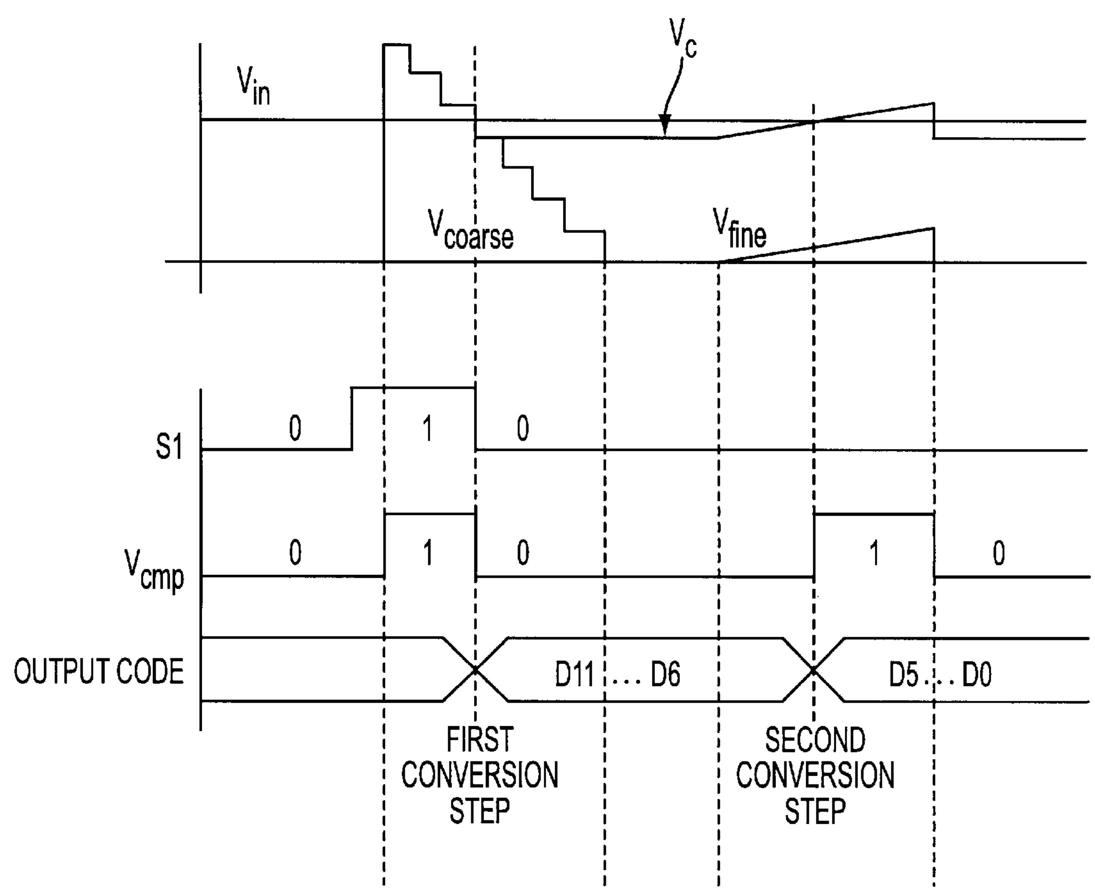
FIG. 3 is a representative timing diagram for the double ramp ADC illustrated in FIG. 2.

Referring to FIGS. 2 and 3, the operation of the double ramp ADC 300 is now described. By means of example only, it is presumed that the CMOS sensor and the double ramp ADC have a 12-bit resolution. The output digital code, therefore, will contain twelve bits, D11 through D0, with D11 being the most significant bit and D0 being the least significant bit.

During the conversion process, the input voltage Vin will be compared with a generated comparison voltage Vc. In the first conversion step, the fine ramp voltage Vfine is set to zero. In addition, the switch 304 is closed and the coarse ramp voltage Vcoarse is gradually changed from a maximum value to a minimum value in coarse voltage steps (i.e., steps greater than a single digital bit).

In a preferred embodiment, the coarse ramp voltage Vcoarse is associated with the most-significant bits ("MSBs") of the output digital code, while the fine ramp voltage Vfine is associated with the least-significant bits ("LSBs") of the output digital code. For example, if the ADC 300 had a 12-bit resolution, then the coarse ramp voltage Vcoarse would be associated with the most significant six bits D11 to D6. The fine ramp voltage Vfine would be associated with the least significant six bits D5 to D0. It should be appreciated that any desired correlation between the coarse and fine ramp voltages and the number of bits in the output digital code can be used to practice the invention. That is, there could be less coarse ramp voltages Vcoarse having a larger range of fine ramp voltages Vfine. Conversely, there could be more coarse ramp voltages Vcoarse having a smaller range of fine ramp voltages Vfine. An exemplary circuit for generating the coarse and fine voltages Vcoarse, Vfine will be described below in more detail with respect to FIG. 5.

Sometime during the first conversion step, when the coarse ramp voltage Vcoarse is less than or equal to the input voltage Vin, the comparator output voltage Vcmp changes from a one to a zero, which is a signal for the control logic (FIG. 5) to latch the most significant bits, D11 to D6, in the output digital code (i.e., the bits used to generate the coarse ramp voltage Vcoarse). The control logic will also use the change in the comparator output voltage Vcmp to open the switch 304 (illustrated in FIG. 3 as signal S1 going to zero). During the time that the switch 304 was closed, the capacitor 302 was constantly being charged with the coarse ramp voltage Vcoarse. When the switch 304 is opened, the charging of the capacitor 302 is interrupted and the last coarse ramp voltage Vcoarse is saved within the capacitor 302.

During the second conversion step (also illustrated in FIG. 3), the fine ramp voltage Vfine is gradually changed from zero up to its maximum (i.e., the maximum allowable value within the range of the coarse voltage—in this example, the voltage associated with the six LSBs). Because the switch 304 is open, the fine ramp voltage Vfine is added to the coarse ramp voltage Vcoarse that is stored in the capacitor 302. As such, the generated comparison voltage Vc is equal to the saved coarse ramp voltage Vcoarse plus the fine ramp voltage Vfine. The generated comparison voltage Vc is compared to the input voltage Vin. Sometime during the second step, when the generated comparison voltage Vc is equal to the input voltage Vin, the comparator output voltage Vcmp changes from a zero to a one, which is a signal for the control logic (FIG. 5) to latch the least significant bits, D5 to D0, in the output digital code (i.e., the bits of the code used to generate the fine ramp voltage Vfine). The MSBs, D11 to D6, and LSBs, D5 to D0, form the converted output digital code representing the original analog input voltage Vin.

It is worth noting that the coarse ramp voltage Vcoarse could be gradually changed from a minimum value to a maximum value in coarse voltage steps if so desired. To do so, the inputs to the comparator 306 would have to be arranged such that the comparator 306 output changes its value when the coarse ramp voltage Vcoarse becomes greater than the input voltage Vin. In addition, the MSBs from the previous step/comparison would have to be latched since they reflect the proper coarse voltage, and either the capacitor 302 must contain the voltage associated with the latched MSBs or a fine voltage must be subtracted from the current voltage. Similarly, it is worth noting that the fine ramp voltage Vfine could be gradually changed from a maximum value to a minimum value in fine voltage steps if so desired.

The benefits that the double ramp ADC 300 provide can be best be seen with a comparison to the operation of the single ramp ADC. As noted above, if the single ramp ADC has a 12-bit resolution (i.e., a 12-bit digital output), then the conversion of the input voltage Vin could require $2^{12}$ or 4,096 conversion steps. The double ramp ADC 300 of the present invention, on the other hand, begins by splitting up the conversion process into a coarse step covering the six MSBs and a fine step covering the six LSBs. This means, for the coarse step, the double ramp ADC 300 would take at most $2^6$ or 64 steps. For the fine step, the double ramp ADC 300 would take at most $2^6$ or 64 steps. Therefore, in the worst case, the double ramp ADC 300 would take at most 128 steps. This is 3,968 steps fewer than the conventional single ramp ADC currently being used in prior art CMOS sensors. As such, the double ramp ADC 300 reduces the analog-to-digital conversion time by up to $2^{(n/2-1)}$ times when compared to the conventional conversion process, where n is a number of bits of digital output (i.e., resolution) of the ADC 300. It should be appreciated that the number of steps taken in the double ramp ADC 300 would be no more than $2^{(n/2+1)}$ steps.

The illustrated double ramp ADC 300 is designed such that two separate voltage sources are used to generate the coarse and fine ramp voltages Vcoarse, Vfine. One way to provide these voltages is to generate them using two separate devices such as DACs. Using two DACs would work, but would require separate reference voltages for the DACs, which must maintain a precise mutual ratio. It may also be undesirable to use separate devices to generate the coarse and fine ramp voltages Vcoarse, Vfine for other reasons, such as chip space. The other way to provide the coarse and fine ramp voltages Vcoarse, Vfine is to use one DAC that is typically used with a conventional ramp ADC and a slightly modified version of the double ramp ADC 300.

Figure 4:
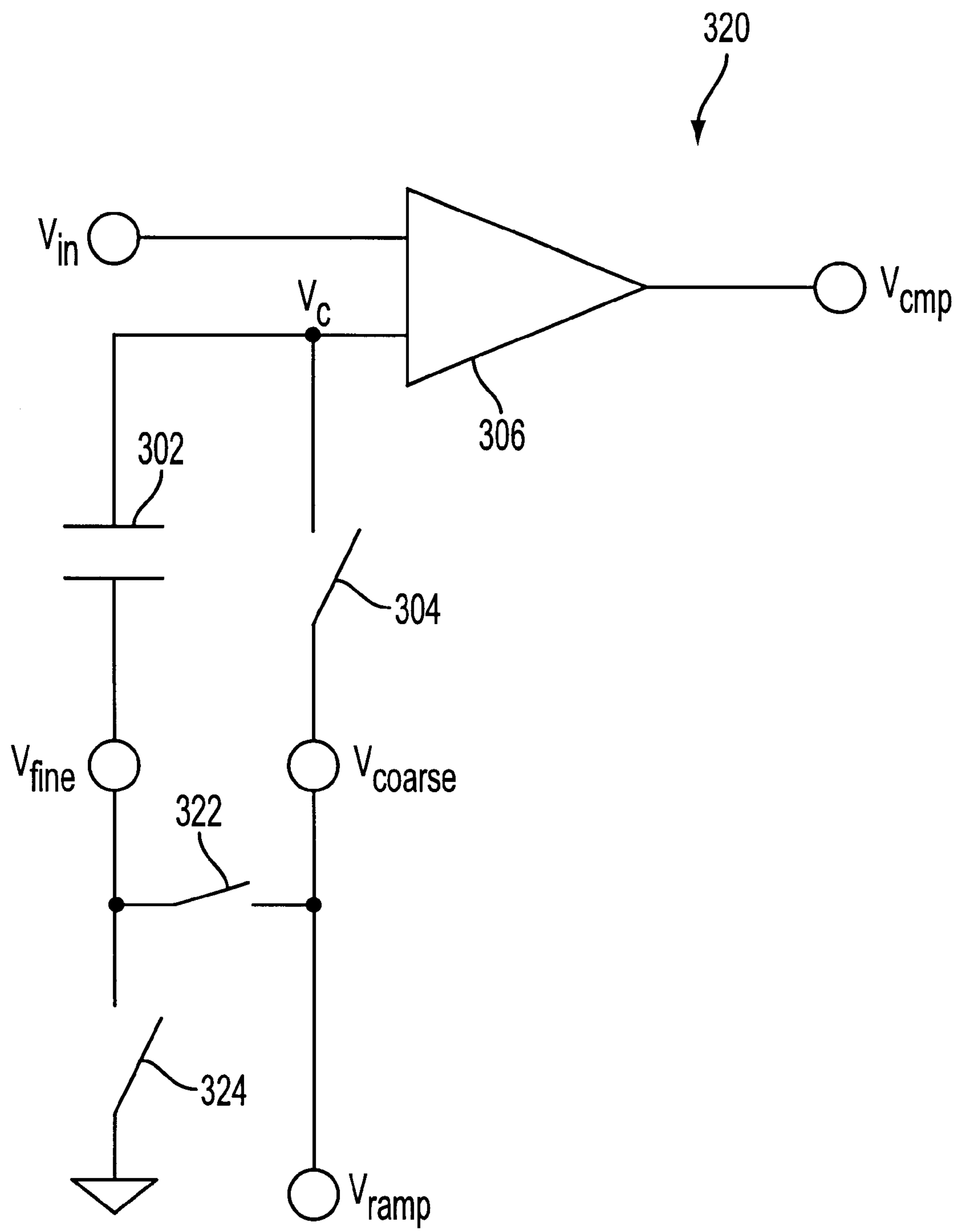
FIG. 4 is a circuit diagram illustrating another exemplary double ramp ADC constructed in accordance with another embodiment of the invention.

FIG. 4 is a circuit diagram illustrating another exemplary double ramp ADC 320 constructed in accordance with another embodiment of the invention. This double ramp ADC 320 will input one ramp voltage Vramp and generate the necessary coarse and fine ramp voltages Vcoarse, Vfine from the ramp voltage Vramp. Since the ADC 320 of this embodiment inputs only one ramp voltage Vramp, only one DAC is required (described below in more detail).

The ADC 320 includes a capacitor 302, three switches 304, 322, 324 and a comparator 306. As such, the ADC 320 is substantially similar to the ADC 300 (FIG. 2). Thus, the comparator 306 receives the input voltage Vin to be converted and a generated compare voltage Vc. The comparator output Vcmp is high while the input voltage Vin is greater than or equal to the compare voltage Vc.

In the illustrated embodiment, the capacitor 302 is connected to a fine ramp voltage Vfine terminal as well as an input of the comparator 306. The switch 304 is connected to a coarse ramp voltage Vcoarse terminal as well as the input of the comparator 306 connected to the capacitor. The fine ramp voltage Vfine terminal is connected to a ground potential via the third switch 324. The coarse ramp voltage Vcoarse terminal is connected to the input ramp voltage Vramp (generated by e.g., a DAC). The second switch 322 is connected between the fine ramp voltage Vfine and coarse ramp voltage Vcoarse terminals.

The illustrated ADC 320 works as follows. The ramp voltage Vramp is generated by a ramp voltage generator (e.g., a DAC). During the first conversion step, the first and third switches 304, 324 are closed and the second switch 322 is open. The ramp generator generates the coarse ramp voltage Vcoarse (as described above with respect FIG. 3). With the switches 304, 322, 324 in this configuration, the ramp voltage Vramp is directed to the Vcoarse terminal. During the second conversion step, the first and third switches 304, 324 are opened and the second switch 322 is closed. The ramp generator generates the fine ramp voltage Vfine (as described above with respect to FIG. 3). With the switches 304, 322, 324 in this configuration, the ramp voltage Vramp is directed to the Vfine terminal through the second switch 322.

Thus, only one ramp voltage Vramp generator is required by the illustrated double ramp ADC 320. Thus, the ADC 320 of this embodiment overcomes the shortcomings of the ADC 300 illustrated in FIG. 2. Moreover, the use of one DAC as the ramp generator has an additional advantage. If an offset between the coarse and fine ramp voltage Vcoarse and Vfine is introduced due to parasitic capacitance in the switches 304, 322, 324, then the offset can be measured during a calibration process and then subtracted out (digitally) in the ramp generator when the generator is generating the coarse and fine ramp voltages Vcoarse, Vfine.

Figure 5:
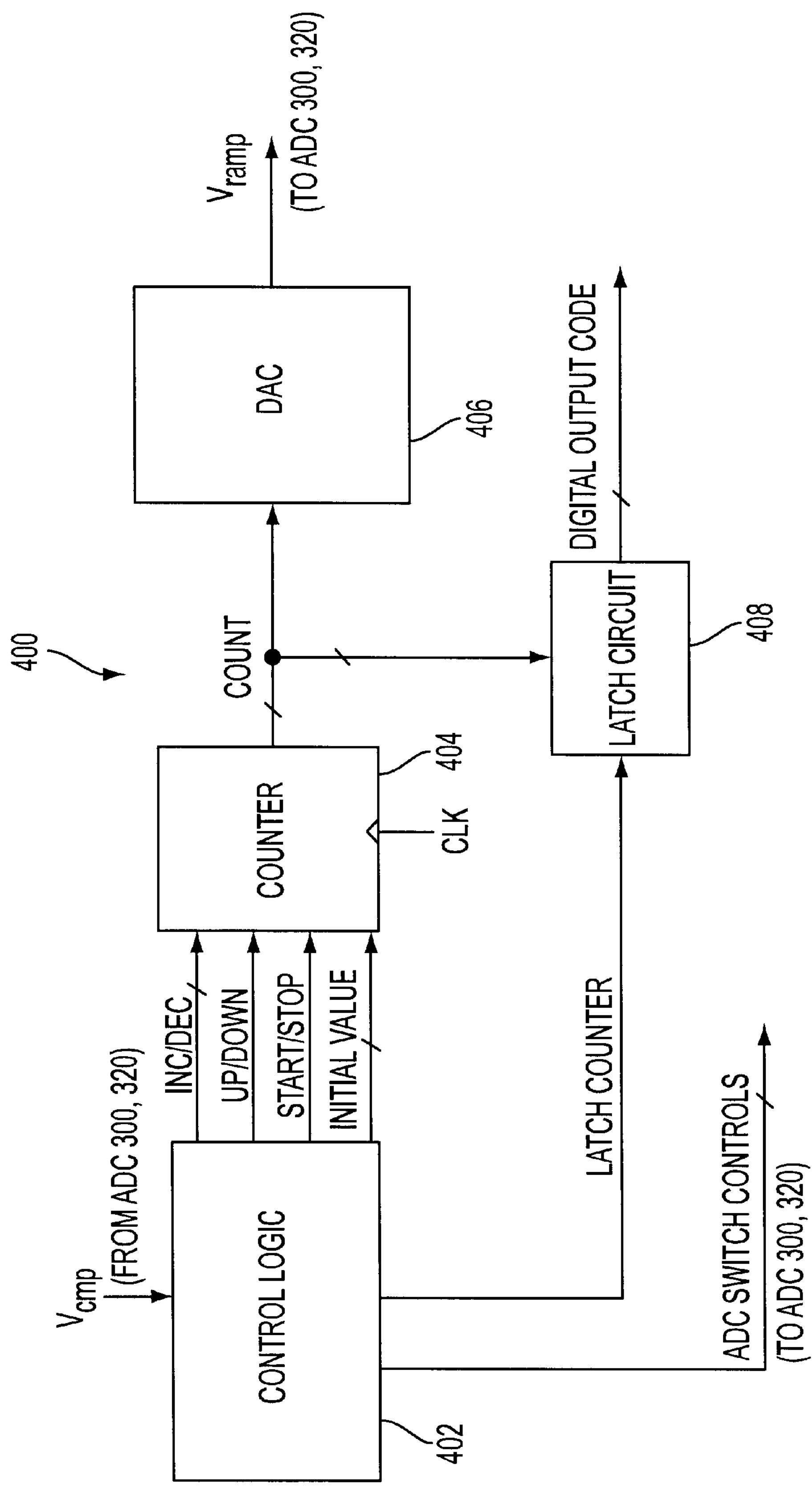
FIG. 5 is a block diagram illustrating an exemplary control circuit for controlling the double ramp ADCs illustrated in FIGS. 2 and 4.

FIG. 5 is a block diagram illustrating an exemplary control circuit 400 for controlling the double ramp ADCs 300, 320 illustrated in FIGS. 2 and 4. The circuit 400 includes control logic 402, a counter 404, DAC 406 and a latch circuit 408. The DAC 406 will input a digital counter value COUNT and generate an analog ramp voltage Vramp that is sent to the ADCs 300, 320 of the invention. As noted above, the ramp voltage Vramp will be the coarse ramp voltages Vcoarse during the first conversion step and the fine ramp voltages Vfine during the second conversion step.

The manner in which the DAC 406 receives the digital codes required to generate the coarse and fine ramp voltages Vcoarse, Vfine is now described. The Control logic 402 programs the counter 404 by sending it an initial counter value over the INITIAL VALUE lines, a count up/down signal over an UP/DOWN line and an increment/decrement value over the INC/DEC lines. A start/stop counter signal line START/STOP is used to start or stop the counter 404. The counter 404 inputs these signals and data and, when enabled, begins counting (up or down) with the appropriate increment/decrement every clock CLK cycle. The counter 404 outputs the digital counter value COUNT to the DAC 406 every clock CLK cycle.

For the first conversion step, the control logic 402 sets the counter to the maximum count value via the INITIAL VALUE lines. The control logic 402 sets the counter to count down via the UP/DOWN line and sets the appropriate decrement value via the INC/DEC lines. Since it is desirable for the counter to count in coarse steps, the decrement should be set such that only the MSBs are decremented. In the present example, the decrement should be $2^6$ or sixty-four since the first MSB is bit six, D6. If for example, the ADC had only ten bits of resolution, the MSB would be bits nine to five (LSBs bit zero to four). As such, the decrement would be set to $2^5$ or thirty-two. The control logic also changes the states of the switches 304, 322, 324 in the ADCs 300, 320 (as described above) via the ADC SWITCH CONTROL lines so that the switches 304, 322, 324 are ready for the first step. When the first conversion step is to begin, the control logic 402 issues a start counter signal via the START/STOP signal line.

When the control logic 402 detects that the comparator output Vcmp has switched from a one to a zero (i.e., the correct coarse voltage has been found), the logic 402 issues stop counter signal to the counter 404 and a latch counter signal to the latch circuit 408, which latches the counter value COUNT. The control logic also changes the states of the switches 304, 322, 324 in the ADCs 300, 320 (as described above) via the ADC SWITCH CONTROL lines so that the switches are ready for the second step. The control logic 402 then resets the counter 404 for the second conversion step.

That is, the control logic 402 sets the counter to zero via the INITIAL VALUE lines. The control logic 402 sets the counter to count up via the UP/DOWN signal and sets the appropriate increment value via the INC/DEC lines. Since it is desirable for the counter to count in fine steps, the increment should be set to one. When the second conversion step is to begin, the control logic 402 issues a start counter signal via the START/STOP signal line.

When the control logic 402 detects that the comparator output Vcmp has switched from a zero to a one (i.e., the correct coarse plus fine voltage has been found), the logic 402 issues a stop counter signal to the counter 404 and a latch counter signal to the latch circuit 408, which latches the counter value COUNT and outputs the digital code DIGITAL OUTPUT CODE corresponding to the input voltage Vin.

It should be appreciated that the invention is not limited to the illustrated control circuit 400 and that any circuit suitable for generating the necessary ramp voltages, controlling the switches 304, 322, 324 within the ADCs 300, 320 and latching the MSBs and LSBs of the digital code may be used to practice the invention. It should be appreciated that the counter 404 could be partitioned into a coarse counter portion and a fine counter portion. This would alleviate the need for some of the control signals. Similarly, the latch circuit 408 could be partitioned into a coarse latch portion and a fine latch portion if so desired.

Moreover, it is possible to set up the control circuit 400 such that the coarse ramp voltage Vcoarse could be gradually changed from a minimum value to a maximum value in coarse voltage steps if so desired. To do so, the inputs to the comparator 306 would have to be arranged such that the comparator 306 output changes its value when the coarse ramp voltage Vcoarse becomes greater than the input voltage Vin. In addition, the MSBs from the previous step/comparison would have to be latched since they reflect the proper coarse voltage, and either the capacitor 302 must contain the voltage associated with the latched MSBs or a fine voltage must be subtracted from the current voltage. Similarly, it is worth noting that the fine ramp voltage Vfine could be gradually changed from a maximum value to a minimum value in fine voltage steps if so desired. Thus, the invention is not limited to any particular sequence of coarse and fine ramp voltages.

It should be appreciated that the invention is not limited to a two-input comparator configuration as illustrated in FIGS. 2 and 4. That is, the illustrated exemplary double ramp ADCs 300, 320 use a two-input comparator 306. The two-input comparator 306 can be replaced by a single-input high ratio amplifier. During the first conversion step, the input voltage Vin would include the voltage of the analog signal to be converted plus the coarse ramp voltage Vcoarse. During the second conversion step, the input voltage Vin would include the voltage of the analog signal to be converted plus the fine ramp voltage Vfine plus the voltage stored in the storage capacitor. The use of a single-input amplifier in the conversion process of an image sensor is discussed in 2000 IEEE International Solid-State Circuits Conference, "MP 6.4 A 60 mW 10b CMOS Image Sensor with Column-to-Column FPN Reduction" by Sugiki et al., which is hereby incorporated by reference.

Figure 6:
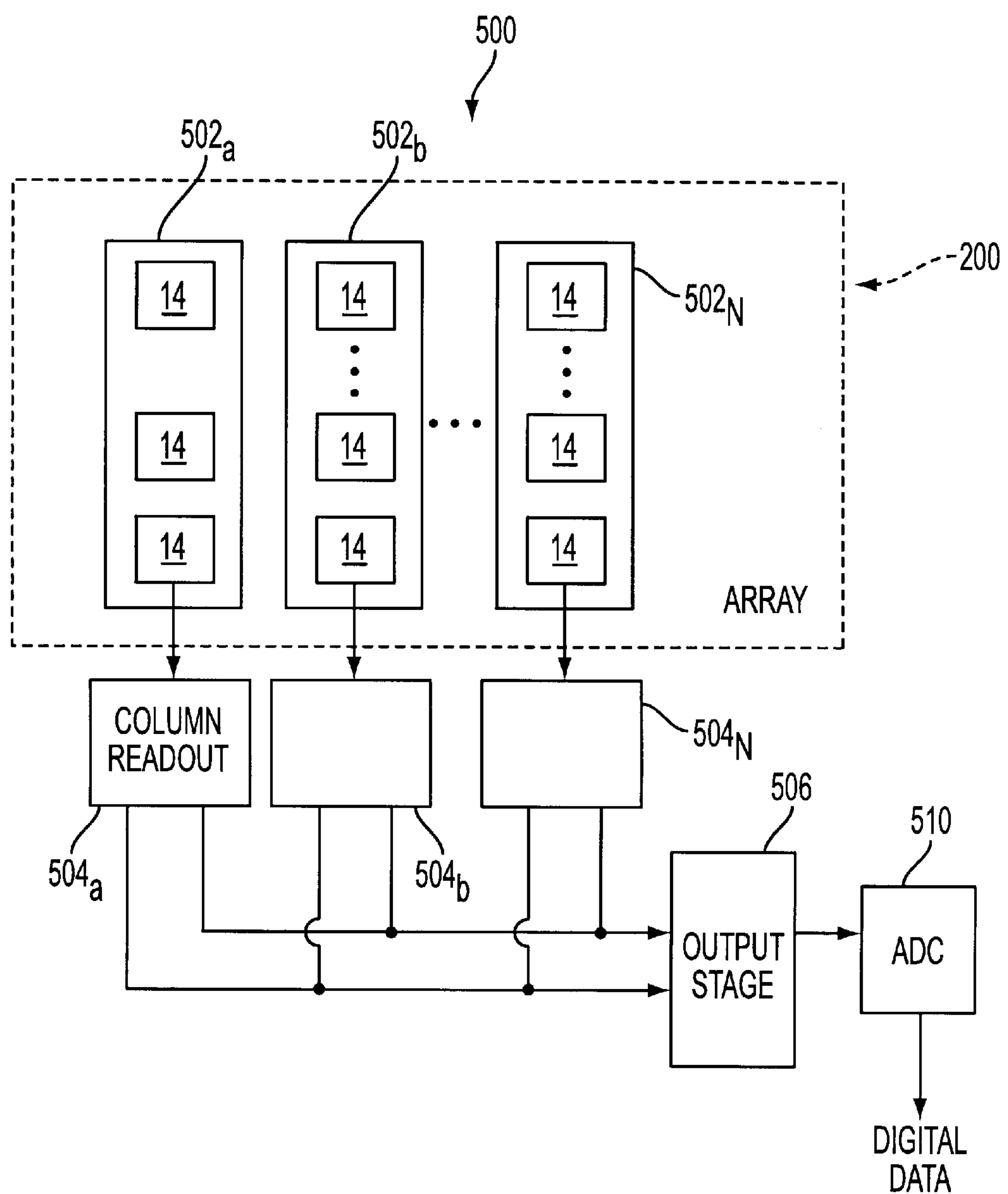
FIG. 6 is a block diagram of a CMOS image sensor chip constructed in accordance with one exemplary embodiment of the invention.
Figure 7:
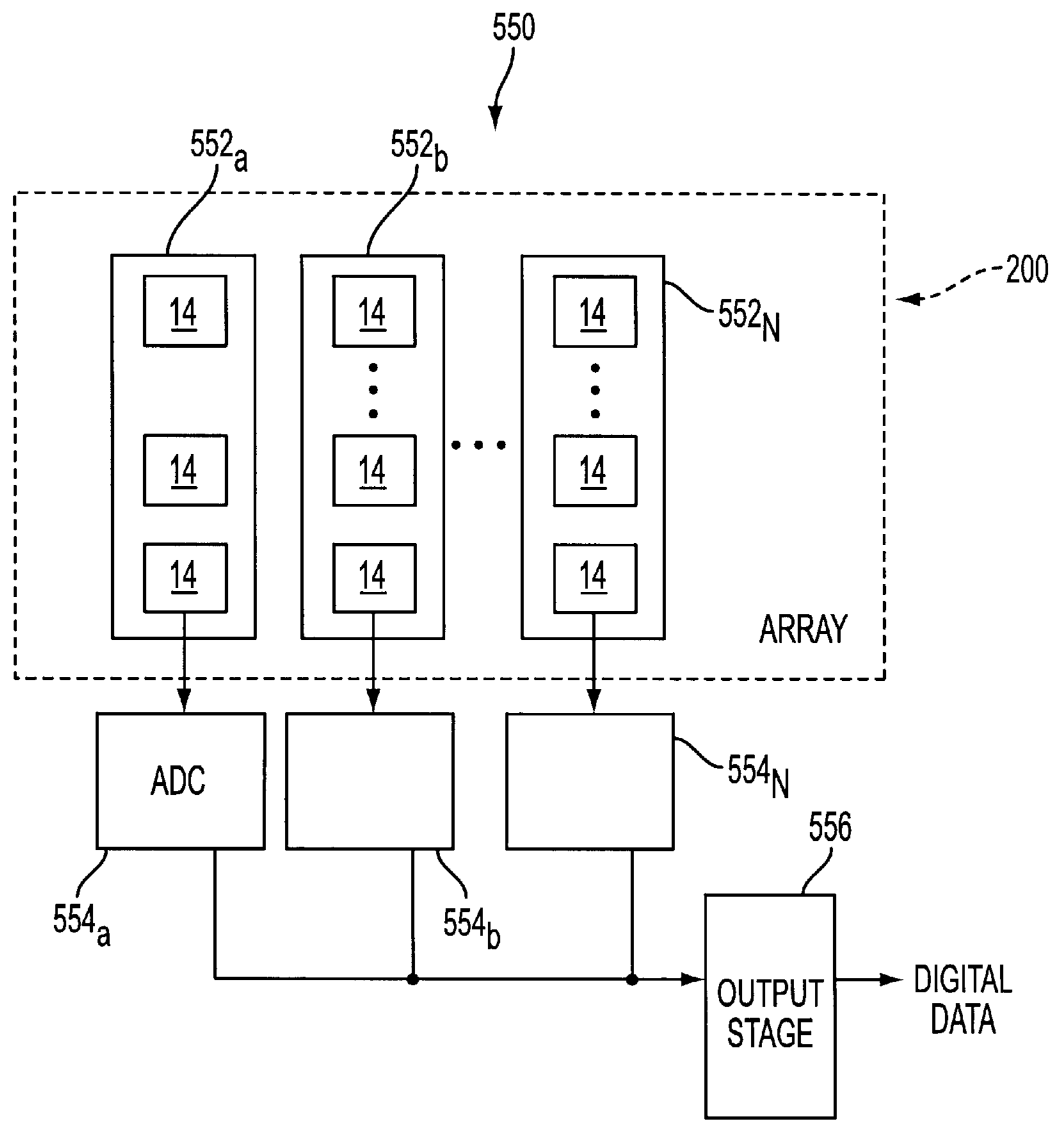
FIG. 7 is a block diagram of a CMOS image sensor chip constructed in accordance with another exemplary embodiment of the invention.
Figure 8:
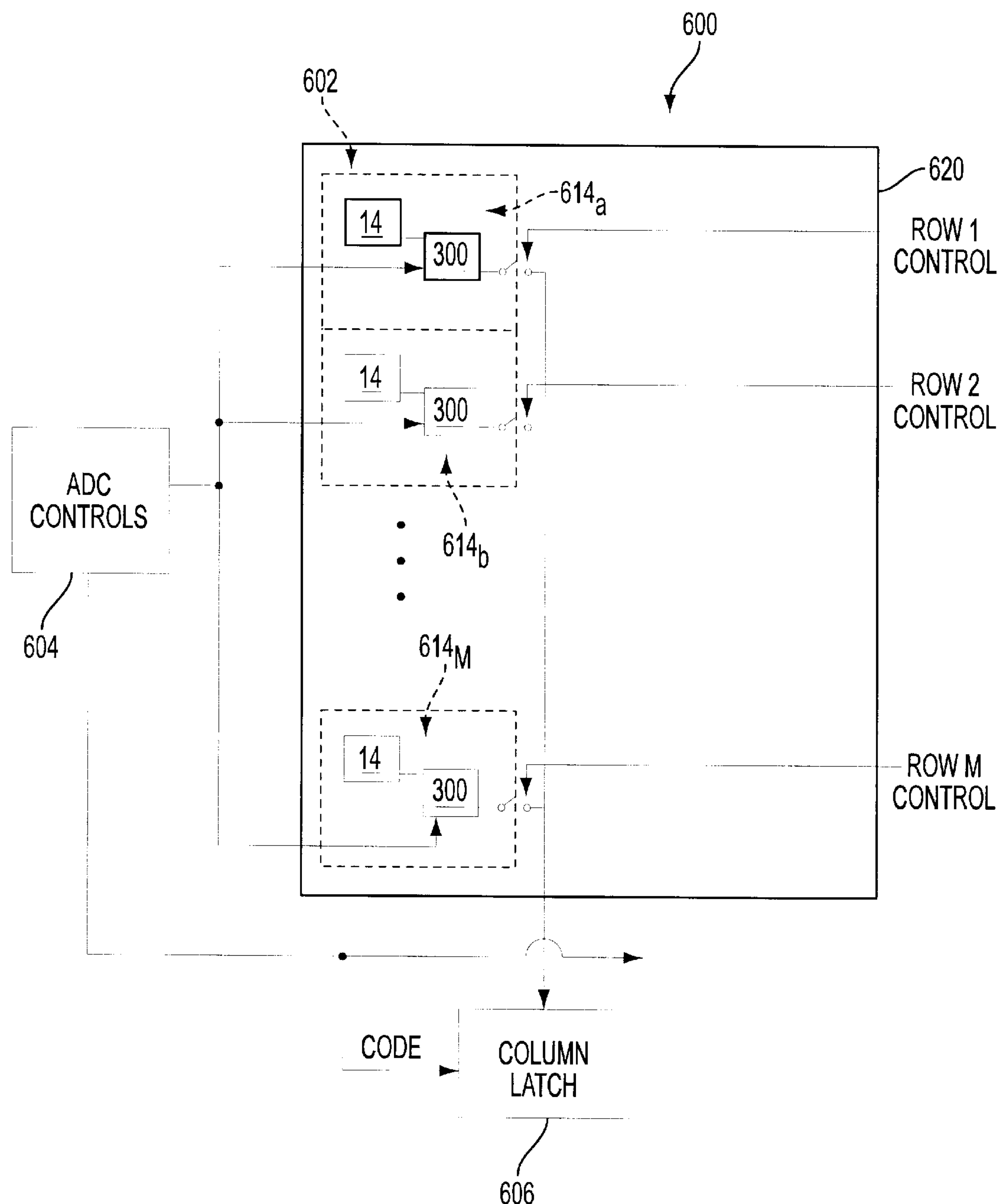
FIG. 8 is a block diagram of a CMOS image sensor chip constructed in accordance with yet another exemplary embodiment of the invention.

The double ramp ADC circuits of the present invention can be implemented into the CMOS sensor in at least three ways depending upon the preference of the user and/or the desired application. FIGS. 6–8 are block diagrams illustrating three ways in which the present invention can be implemented into a CMOS image sensor. It should be noted that the present invention is not to be limited to any particular implementation and that the following three implementations are merely examples.

FIG. 6 illustrates a CMOS sensor 500 that routes all of its analog pixel information to a single ADC circuit 510. The sensor 500 comprises a pixel array 200 organized into a plurality of columns 502$_a$, 502$_b$, . . . 502$_n$. Each column 502$_a$, 502$_b$, . . . 502$_n$ has a plurality of pixels 14 forming rows therein. Outside the array 200, is a plurality of column readout circuits 504$_a$, 504$_b$, . . . 504$_n$ respectively connected to one of the columns 502$_a$, 502$_b$, . . . 502$_n$. Each column readout circuit 504$_a$, 504$_b$, . . . 504$_n$ is connected to an output stage 506. The output stage 506 is connected to an ADC circuit 510 constructed using one of the ADCs 300, 320 of the invention and appropriate control circuitry (e.g., DAC, control logic, latches). The output stage 506 contains all of the necessary circuitry and logic to coordinate the input of information from all of the columns.

In operation, timing and control circuitry causes the pixels 14 to be reset and the voltage associated with the reset pixels to be output to the column readout circuits 504$_a$, 504$_b$, . . . 504$_n$. The timing and control circuitry then causes the charge in the pixels 14 to be read out and the voltage associated with the charge to be output to the column readout circuits 504$_a$, 504$_b$, . . . 504$_n$. This is known in the art as correlated double sampling and is typically the preferred way to read out the image signal of the pixels 14. Another known technique is to read out the reset signal from the next image frame and perform the subtraction (merely referred to as double sampling).

The reset and charge voltages are sent to the output stage 506, which performs a subtraction to obtain the voltage of the image signal for the respective pixels. It should be appreciated that the subtraction of the pixel charges can be done in the column readout circuits if so desired. Since these voltages are in analog form, they must be sent to the ADC 510 for conversion to a digital code. Because the sensor 500 uses one of the ADCs 300, 320 of the present invention, the analog-to-digital conversion can be performed in substantially less steps than the prior CMOS sensors. This means that the sensor 500 operates much faster than the prior CMOS sensors (i.e., up to $2^{(n/2-1)}$ times faster, where n is the resolution of the sensor).

FIG. 7 illustrates a CMOS sensor 550 that routes analog pixel information from a single column 552$_a$, 552b, . . . 552$_n$ to an ADC circuit 554$_a$, 554$_b$, . . . 554$_n$ dedicated to a particular column 552$_a$, 552$_b$, . . . 552$_n$. The sensor 550 comprises a pixel array 200 organized into a plurality of columns 552$_a$, 552$_b$, . . . 552$_n$. Each column 552$_a$, 552$_b$, . . . 552$_n$ has a plurality of pixels 14 forming rows therein. Outside the array 200, is a plurality of ADC circuits 554$_a$, 554$_b$, . . . 554$_n$ respectively connected to one of the columns 502$_a$, 502$_b$, . . . 502$_n$. Each ADC circuit 554$_a$, 554$_b$, . . . 554$_n$ is connected to an output stage 556. Each ADC circuit 554$_a$, 554$_b$, . . . 554$_n$ is constructed using one of the ADCs 300, 320 of the invention and appropriate control circuitry. The output stage 556 contains all of the necessary circuitry and logic to coordinate the input of information from all of the ADC circuits $554_a$, $554_b$, . . . $554_n$.

In operation, timing and control circuitry causes the pixels 14 to be reset and the voltage associated with the reset pixels to be output to the ADC circuits $554_a$, $554_b$, . . . $554_n$, which output respective digital codes to the output stage 556. The timing and control circuitry then causes the charge in the pixels 14 to be read out and the voltage associated with the charge to be output to the ADC circuit $554_a$, $554_b$, . . . $554_n$, which output respective digital codes to the output stage 556. The output stage 566 performs a subtraction of the digital codes to obtain the digital code of the image signal for the respective pixels. Because the sensor 550 uses one of the ADCs 300, 320 of the present invention, the analog-to-digital conversions are performed in substantially less steps than the prior CMOS sensors. This means that the sensor 550 operates much faster than the prior CMOS sensors. Circuitry must be provided to ensure that the ADCs are read out in sequence or have a multiplexer within the output stage 556 to sequence out the ADCs outputs.

FIG. 8 illustrates a CMOS sensor 600 that uses pixels $614_a$, $614_b$, . . . $614_m$, comprised of conventional pixels 14 each having their own respective ADC circuit 300 (as shown in FIG. 2). Each column 602 comprises a plurality of pixels $614_a$, $614_b$, . . . $614_m$, which are connected to a column latch circuit 606 via switches controllable by row control signals ROW 1 CONTROL, ROW 2 CONTROL, . . . ROW M CONTROL. Each ADC 300 is connected to a global ADC control circuit 604, which provides all of the necessary control hardware and logic needed to perform analog-to-digital conversion of the pixel image information.

In operation, timing and control circuitry causes the pixels 14 to be reset and the voltage associated with the reset pixels to be output to its associated ADC circuit 300. When the ADC circuit 300 is connected to the column latch 606 (when the row control signal close the switch), the digital code representing the converted reset voltage is output to the latch 606. The timing and control circuitry then causes the charge in the pixels 14 to be read out and the voltage associated with the charge to be output to its associated ADC circuit 300. When the ADC circuit 300 is connected to the column latch 606 (when the row control signal close the switch), the digital code representing the image voltage is output to the latch 606. An output stage (not shown) can be used to retrieve the latched digital code, perform necessary subtractions and output of the subtracted codes.

Figure 9:
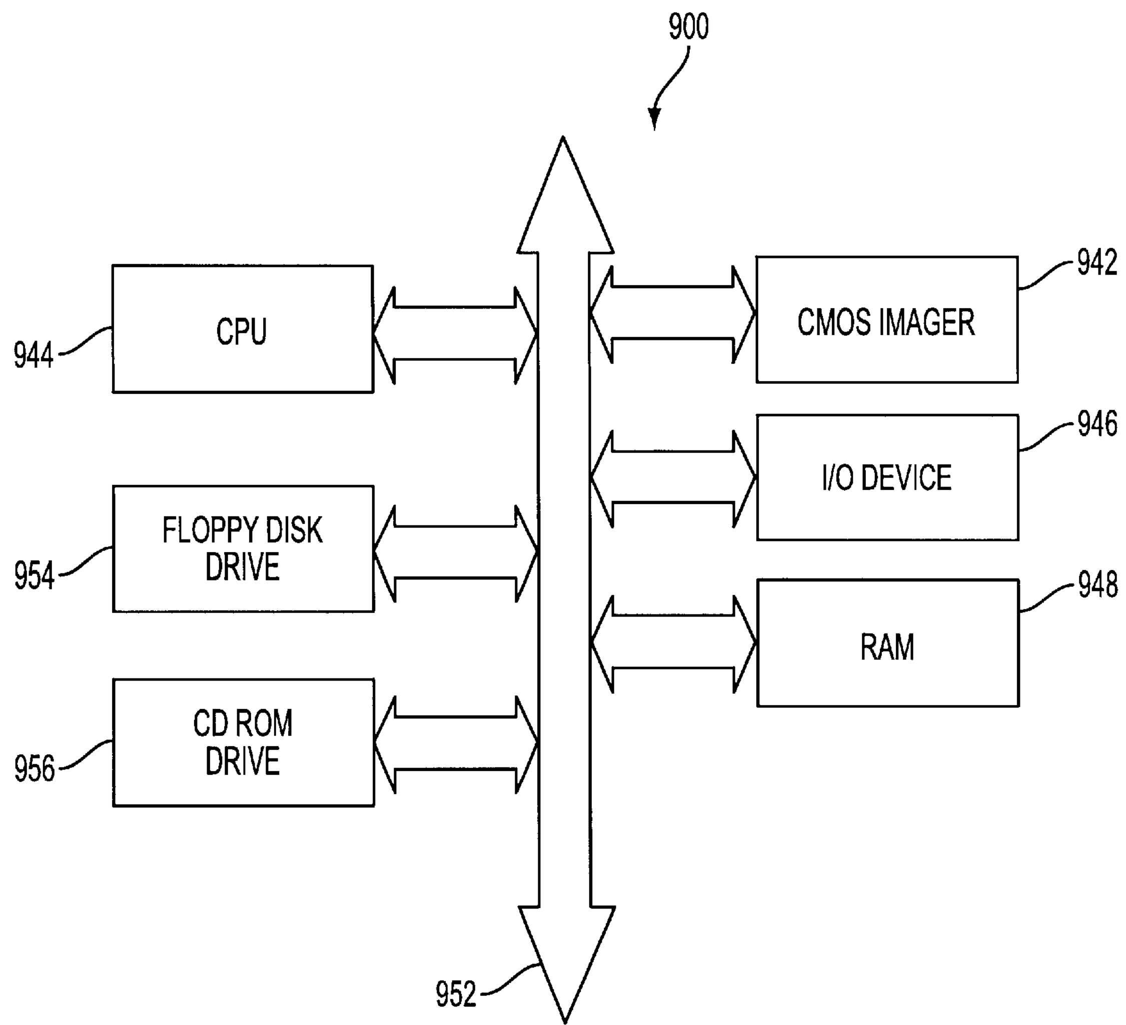
FIG. 9 is a block diagram illustrating a processor system utilizing a CMOS pixel sensor chip constructed in accordance with an embodiment of the invention.

A typical processor based system 900, which has a connected CMOS imager having and ADC constructed according to the invention is illustrated in FIG. 9. A processor based system is exemplary of a system having digital circuits which could include a CMOS image sensor. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 944, for example, a microprocessor, that communicates with an input/output (I/O) device 946 over a bus 952. The CMOS imager 942 communicates with the system over bus 952. The system 900 also includes random access memory (RAM) 948, and may include peripheral devices such as a floppy disk drive 954, and a compact disk (CD) ROM drive 956 which also communicate with CPU 944 over the bus 952. It may also be desirable to integrate the processor 944, CMOS image sensor 942 and memory 948 on a single integrated circuit.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. An image sensor comprising:

an array of pixels organized into a plurality of rows and columns; and at least one double ramp analog-to-digital converter, said converter inputting an analog signal from at least one of said pixels and converting said analog signal into a digital code, said converter having an n-bit resolution, wherein the converter converts said analog signal into said digital signal in no more than $2^{(n/2-1)}$ steps.

2. The image sensor of claim 1, wherein said double ramp analog-to-digital converter converts the analog signal using a two step conversion process.

3. The image sensor of claim 1, wherein said double ramp analog-to-digital converter converts the analog signal by comparing the signal to a first ramp voltage to obtain a first part of the digital code and then comparing the signal to a second ramp voltage to obtain a second part of the digital code.

4. The image sensor of claim 3, wherein the first ramp voltage is a coarse ramp voltage.

5. The image sensor of claim 3, wherein the second ramp voltage is a fine ramp voltage.

6. The image sensor of claim 3, wherein said first part of the digital code corresponds to the most significant bits of the n-bit resolution and said second part of the digital code corresponds to the least significant bits of the n-bit resolution.

7. The image sensor of claim 1 further comprising a plurality of double ramp analog-to-digital converters, each of said converters being connected to a respective column of said array.

8. The image sensor of claim 1 further comprising a plurality of double ramp analog to digital converters, each of said converters being connected to a respective pixel of said array.

9. An image sensor comprising:

an array of pixels organized into a plurality of rows and columns;

at least one double ramp analog-to-digital converter, said converter inputting an analog signal from at least one of said pixels and converting said analog signal into a digital code; and a control circuit for controlling an operation of said double ramp analog-to-digital converter, said control circuit causing said analog-to-digital converter to convert the analog signal using a two step conversion process, wherein during a first step of the conversion process said control circuit sends a gradually decreasing first voltage to said converter until said converter indicates that the first voltage is less than a voltage of the analog signal.

10. The image sensor of claim 9 wherein said control circuit latches a first portion the digital code when said converter indicates that the first voltage is less than the voltage of the analog signal.

11. The image sensor of claim 9 wherein during a second step of the conversion process said control circuit sends a gradually increasing second voltage to said converter until said converter indicates that the second voltage is equal to the voltage of the analog signal.

12. The image sensor of claim 11 wherein said control circuit latches a second portion of the digital code when said converter indicates that the second voltage is equal to the voltage of the analog signal.

13. An image sensor comprising:

an array of pixels organized into a plurality of rows and columns, at least one double ramp analog-to-digital converter, said converter inputting an analog signal from at least one of said pixels and converting said analog signal into a digital code, and a control circuit for controlling an operation of said double ramp analog-to-digital converter, said control circuit causing said analog-to-digital converter to convert the analog signal using a two step conversion process, wherein said control circuit comprises:

a counter for generating a digital count;

a digital-to-analog converter connected to receive the digital count from said counter, said digital-to-analog converter outputting an analog ramp voltage based on the digital count; and control logic coupled to said counter and said double ramp analog-to-digital converter, wherein during a first step of the conversion process, said control logic causes said counter to generate a gradually decreasing digital count such that the digital-to-analog converter generates a gradually decreasing ramp voltage until said analog-to-digital converter indicates that the gradually decreasing ramp voltage is less than a voltage of the analog signal.

14. The image sensor of claim 13, wherein during a second step of the conversion process, said control logic causes said counter to generate a gradually increasing digital count such that the digital-to-analog converter generates a gradually increasing ramp voltage until said analog-to-digital converter indicates that the gradually increasing ramp voltage is equal to the voltage of the analog signal.

15. An image sensor comprising:

an array of pixels organized into a plurality of rows and columns; and at least one double ramp analog-to-digital converter, said converter inputting an analog signal from at least one of said pixels and converting said analog signal into a digital code, wherein said double ramp analog-to-digital converter comprises:

a comparator having a first input connected to receive the analog signal;

a first voltage storage means coupled between a second ramp voltage terminal and a second input of said comparator; and a switch coupled between a first ramp voltage terminal and the second input of said comparator, wherein when said switch is in a first position, said comparator compares the signal to a first ramp voltage input on said first ramp voltage terminal, and when said switch is in a second position said comparator compares the signal to a second ramp voltage input on said second ramp voltage terminal plus a stored voltage in said storage means.

16. The image sensor of claim 15, wherein the first ramp voltage is a coarse voltage and the second ramp voltage is a fine ramp voltage.

17. The image sensor of claim 15, wherein said double ramp analog-to-digital converter further comprises:

a second switch coupled between said second ramp voltage terminal and a potential; and a third switch coupled between said first and second ramp voltage terminals, wherein said first ramp voltage terminal is connected to an input ramp voltage and when said second switch is closed and said third switch is open, the input ramp voltage is used to generate the first ramp voltage.

18. The image sensor of claim 17, wherein when said second switch is opened and said third switch is closed, the input ramp voltage is used to generate the second ramp voltage.

19. An image sensor comprising:

an array of pixels organized into a plurality of rows and columns; and at least one double ramp analog-to-digital converter having an n-bit resolution, said converter inputting an analog voltage signal from at least one of said pixels and converting said analog signal into a digital code using a two step conversion process, wherein a first step of said conversion process generates a first portion of said digital code and a second step of said conversion process generates a second portion of said digital code.

20. The image sensor of claim 19, wherein said double ramp analog-to-digital converter inputs and uses a first voltage to generate the first portion of said digital code and inputs and uses a second voltage to generate the second portion of said digital code.

21. The image sensor of claim 20, further comprising a control circuit connected to said analog-to-digital converter, said control circuit generating said first and second voltages and storing said digital code.

22. The image sensor of claim 20, further comprising a control circuit connected to said analog-to-digital converter, wherein said control circuit generates said first voltage by gradually decreasing a maximum voltage by a predetermined coarse value based on the resolution of the converter.

23. The image sensor of claim 22 wherein the coarse value corresponds to a most-significant bit of the digital code.

24. The image sensor of claim 22 wherein the fine value corresponds to a least-significant bit of the digital code.

25. The image sensor of claim 20, further comprising a control circuit connected to said analog-to-digital converter, wherein said control circuit generates said second voltage by gradually increasing a minimum voltage by a predetermined fine value based on the resolution of the converter.

26. The image sensor of claim 19 wherein said conversion process is completed in no more than $2^{(n/2+1)}$ comparison steps.

27. The image sensor of claim 19 further comprising a plurality of double ramp analog to digital converters, each of said converters being connected to a respective column of said array.

28. The image sensor of claim 19 further comprising a plurality of double ramp analog to digital converters, each of said converters being connected to a respective pixel of said array.

29. A double ramp analog-to-digital converter for use in an image sensor, said converter having an n-bit resolution and comprising:

a comparator having a first input connected to receive an analog voltage from at least one pixel of a pixel array, a second input connected to receive one of two ramp voltages, wherein said comparator compares the analog voltage to a first ramp voltage during a first conversion step to detect a first conversion voltage and compares the analog voltage to a second ramp voltage plus a stored voltage representing said first conversion voltage during a second conversion step.

30. The double ramp analog-to-digital converter of claim 29 wherein said conversion process is completed in no more than $2^{(n/2+1)}$ comparison steps.

31. The double ramp analog-to-digital converter of claim 29, Wherein the first ramp voltage is a coarse voltage and the second ramp voltage is a fine ramp voltage.

32. The double ramp analog-to-digital converter of claim 31, wherein the fine ramp voltage corresponds to the least-significant bits of the n-bit resolution.

33. The double ramp analog-to-digital converter of claim 31, wherein the coarse ramp voltage corresponds to the most-significant bits of the n-bit resolution.

34. The double ramp analog-to-digital converter of claim 29, further comprising:

a first ramp voltage terminal for receiving the first ramp voltage;

a second ramp voltage terminal for receiving the second ramp voltage;

a first voltage storage means coupled between the second ramp voltage terminal and the second input of said comparator; and a switch coupled between the first ramp voltage terminal and the second input of said comparator, wherein when said switch is in a first position, said comparator compares the analog voltage to the first ramp voltage and when said switch is in a second position said comparator compares the analog voltage to the second ramp voltage plus a stored voltage in said storage means.

35. The double ramp analog-to-digital converter of claim 34 further comprising:

a second switch coupled between said second ramp voltage terminal and a potential; and a third switch coupled between said first and second ramp voltage terminals, wherein said first ramp voltage terminal is connected to an input ramp voltage and when said second switch is closed and said third switch is open, the input ramp voltage is used to generate the first ramp voltage.

36. The double ramp analog-to-digital converter of claim 35, wherein when said second switch is opened and said third switch is closed, the input ramp voltage is used to generate the second ramp voltage.

37. A processor system comprising:

a processor; and an image sensor connected to said processor, said image sensor comprising:

an array of pixels organized into a plurality of rows and columns; and at least one double ramp analog-to-digital converter, said converter inputting an analog signal from at least one of said pixels and converting said analog signal into a digital code.

38. A processor system comprising:

a processor; and an image sensor connected to said processor, said image sensor comprising:

an array of pixels organized into a plurality of rows and columns; and at least one double ramp analog-to-digital converter having an n-bit resolution, said converter inputting an analog voltage signal from at least one of said pixels and converting said analog signal into a digital code using a two step conversion process, wherein a first step of said conversion process generates a first portion of said digital code and a second step of said conversion process generates a second portion of said digital code.

39. A method of converting an analog pixel voltage into a digital code for use in an image sensor, said method comprising the steps of:

inputting the analog pixel voltage;

comparing the analog pixel voltage to a first ramp voltage to obtain a first part of the digital code; and comparing the analog pixel voltage to a second ramp voltage to obtain a second part of the digital code.

40. The method of claim 39, further comprising the steps of:

generating a first voltage for the first ramp voltage;

determining if the first voltage is less than the analog pixel voltage; and if it is determined that the first voltage is not less than the analog pixel voltage, decrementing the first voltage by a predetermined coarse value.

41. The method of claim 40 further comprising the step of repeating said determining step and said decrementing step until it is determined that the first voltage is less than the analog pixel voltage.

42. The method of claim 40, wherein the predetermined coarse value corresponds to a value of a most-significant bits of the digital code.

43. The method of claim 40, further comprising the steps of:

generating a second voltage for the second ramp voltage;

adding the second voltage to the first voltage;

determining if the added voltage is equal to the analog pixel voltage; and if it is determined that the added voltage is not equal to the analog pixel voltage, incrementing the second voltage by a predetermined fine value.

44. The method of claim 43, wherein the predetermined fine value corresponds to a value of a least-significant bits of the digital code.

45. The method of claim 43 further comprising the step of repeating said adding, determining and incrementing steps until it is determined that the added voltage is equal to the analog pixel voltage.

46. The method of claim 39, further comprising the steps of:

generating a first voltage for the first ramp voltage;

determining if the first voltage is greater than the analog pixel voltage; and if it is determined that the first voltage is not greater than the analog pixel voltage, incrementing the first voltage by a predetermined coarse value.

47. The method of claim 46 further comprising the step of repeating said determining step and said incrementing step until it is determined that the first voltage is greater than the analog pixel voltage.

48. The method of claim 46, wherein the predetermined coarse value corresponds to a value of a most-significant bits of the digital code.

49. The method of claim 46, further comprising the steps of:

generating a second voltage for the second ramp voltage;

adding the second voltage to the first voltage;

determining if the added voltage is equal to the analog pixel voltage; and if it is determined that the added voltage is not equal to the analog pixel voltage, decrementing the second voltage by a predetermined fine value.

50. The method of claim 49, wherein the predetermined fine value corresponds to a value of a least-significant bits of the digital code.

51. The method of claim 49 further comprising the step of repeating said adding, determining and decrementing steps until it is determined that the added voltage is equal to the analog pixel voltage.

* * * * *

UNITED STATES PATENT AND TRADEMARK OFFICE

CERTIFICATE OF CORRECTION

PATENT NO. : 6,670,904 B1
DATED : December 30, 2003
INVENTOR(S) : Alex Yakovlev

It is certified that error appears in the above-identified patent and that said Letters Patent is hereby corrected as shown below:

Column 2,
Line 56, reads “A)C” should read -- ADC --.

Column 9,
Line 38, reads “close” should read -- closes --.
Line 44, reads “close” should read -- closes --.
Line 50, reads “and” should read -- an --.

Column 10,
Line 67, reads “portion the” should read -- portion of the --.

Signed and Sealed this

Sixteenth Day of March, 2004

JON W. DUDAS
*Acting Director of the United States Patent and Trademark Office*